(12) United States Patent
Zhong et al.

(10) Patent No.: US 10,916,879 B2
(45) Date of Patent: Feb. 9, 2021

(54) CAN BOX WITH METALLIC REINFORCEMENT PIECE

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Wei-Jian Zhong, Kunshan (CN); Fu-Jin Peng, Kunshan (CN); Qi-Jin Yi, Kunshan (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/744,179

(22) Filed: Jan. 16, 2020

(65) Prior Publication Data

US 2020/0235516 A1 Jul. 23, 2020

(30) Foreign Application Priority Data

Jan. 23, 2019 (CN) .......................... 2019 1 0062998

(51) Int. Cl.
*H01R 13/504* (2006.01)
*H01R 13/639* (2006.01)
*H01R 13/193* (2006.01)
*H01L 23/32* (2006.01)

(52) U.S. Cl.
CPC ........... *H01R 13/504* (2013.01); *H01L 23/32* (2013.01); *H01R 13/193* (2013.01); *H01R 13/639* (2013.01)

(58) Field of Classification Search
CPC .. H01R 13/193; H01R 13/504; H01R 13/639; H01R 23/6833; H01R 23/684; H01R 23/32
USPC .......................................... 439/259, 331, 342
See application file for complete search history.

(56) References Cited

U.S. PATENT DOCUMENTS

| | | | | |
|---|---|---|---|---|
| 5,312,267 A | * | 5/1994 | Matsuoka | H05K 7/1023 |
| | | | | 361/671 |
| 5,443,591 A | * | 8/1995 | Tsai | H01R 13/193 |
| | | | | 439/342 |
| 8,597,035 B1 | * | 12/2013 | Terhune, IV | H05K 7/1061 |
| | | | | 439/73 |

(Continued)

FOREIGN PATENT DOCUMENTS

CN 207572641 U 9/2017
CN 208045742 U 12/2017

*Primary Examiner* — Gary F Paumen
(74) *Attorney, Agent, or Firm* — Wei Te Chung; Ming Chieh Chang (57) ABSTRACT

An electrical connector includes an insulative base and an insulative cover moveable relative to the base along the front-to-back direction. A lever includes an actuating bar sandwiched between the base and the cover and is rotated to move the cover relative to the base. A metallic reinforcement piece is embedded within the base adjacent to the actuating bar. The metallic reinforcement piece includes a main part in compliance with a receiving groove of the base receiving the actuating bar therein, and a pair of wings at two opposite transverse side edge of the receiving groove.

18 Claims, 8 Drawing Sheets

(56) References Cited

U.S. PATENT DOCUMENTS

2003/0064619 A1* 4/2003 Renfro ................ H05K 7/1007
  439/342
2006/0148297 A1* 7/2006 Ma ...................... H05K 7/1061
  439/331
2010/0087081 A1* 4/2010 Yuan ................... H05K 7/1084
  439/342

* cited by examiner

CAN BOX WITH METALLIC REINFORCEMENT PIECE

BACKGROUND OF THE DISCLOSURE

1. Field of the Disclosure

The present disclosure relates to an electrical connector, and particularly to the electrical connector having a reinforced can box cooperating with the rotatable lever

2. Description of Related Arts

U.S. application publication No. 2019/0074634 having the same inventors with the instant invention, discloses the electrical connector equipped with a rotatable lever for actuating a moveable cover for achieving a ZIF (zero insertion force) operation between the conductive pins of the CPU (Central Processing Unit) and the contacts of the connector. Anyhow, during rotation of the lever, a relatively large force is applied to the cam box which supports the lever, thus tending to result in cracking the cam box inadvantageously.

An improved connector is desired to have a reinforced cam box resisting the actuating force applied thereto.

SUMMARY OF THE DISCLOSURE

An object of the invention is to provide an electrical connector with an insulative base and an insulative cover moveable relative to the base along the front-to-back direction. A lever includes an actuating bar sandwiched between the base and the cover and is rotated to move the cover relative to the base. A metallic reinforcement piece is embedded within the base adjacent to the actuating bar. The metallic reinforcement piece includes a main part in compliance with a receiving groove of the base receiving the actuating bar therein, and a pair of wings at two opposite transverse side edge of the receiving groove.

Other objects, advantages and novel features of the disclosure will become more apparent from the following detailed description when taken in conjunction with the accompanying drawings.

DETAILED DESCRIPTION OF THE PREFERRED EMBODIMENT

Referring to FIGS. 1-8, an electrical connector 100 includes an insulative base 1, an insulative cover 2 moveably mounted upon the base 1, a metallic lever 3 sandwiched between the base 1 and the cover 2 to move the cover 2 relative to the base 1, a plurality of contacts 4 disposed in the base 1, a pick-up cap 5 mounted upon the cover 1 for suction operation, and a metallic reinforcement piece 6 embedded within the base 1.

The base 1 includes a main body 11 and a holding region or cam box 12 located at one end of the main body 11 in a front-to-back direction. The base 11 forms a plurality of passageways 13 to receive the corresponding contacts 4, respectively. The holding region 12 includes opposite top face 121 and bottom face 122 in the vertical direction perpendicular to the front-to-back direction, and opposite side faces 123 in the transverse direction perpendicular to the front-to-back direction and the vertical direction. A receiving groove 124 is downwardly formed in the top face 121, and an upstanding block 125 is formed on one side face 123.

The cover 2 includes a supporting plate 21 in alignment with the base 11 in the vertical direction, and an abutting region 22 in alignment with the holding region 12 in the vertical direction. The supporting plate 21 forms a plurality of through holes 23 in alignment with the corresponding passageways 13 for receiving the conductive pins of the CPU. Two seats 24 are formed on one lateral side of the cover 2.

The lever 3 includes an actuating bar 31 sandwiched between the holding region 12 and the abutting region 22 in the vertical direction and received within the receiving groove 124, and an operation bar 32 linked to the actuating bar 31 at ninety degrees so that rotation of the operation bar 32 in a vertical plane may have the actuating bar 31 rotated in the receiving groove 124. The operation bar 32 is located beside the lateral side of the main body 11 and seated upon the two seats 24 when the operation bar 32 is moved to the horizontal position. The actuating bar 31 includes two spaced supporting sections 311, 313 essentially snugly received within the receiving groove 124 for free rotation therein, and an urging section 312 linked between and axially offset from the two supporting sections 311, 313 for urging the cover 2 when the lever is rotated.

Figure 1:
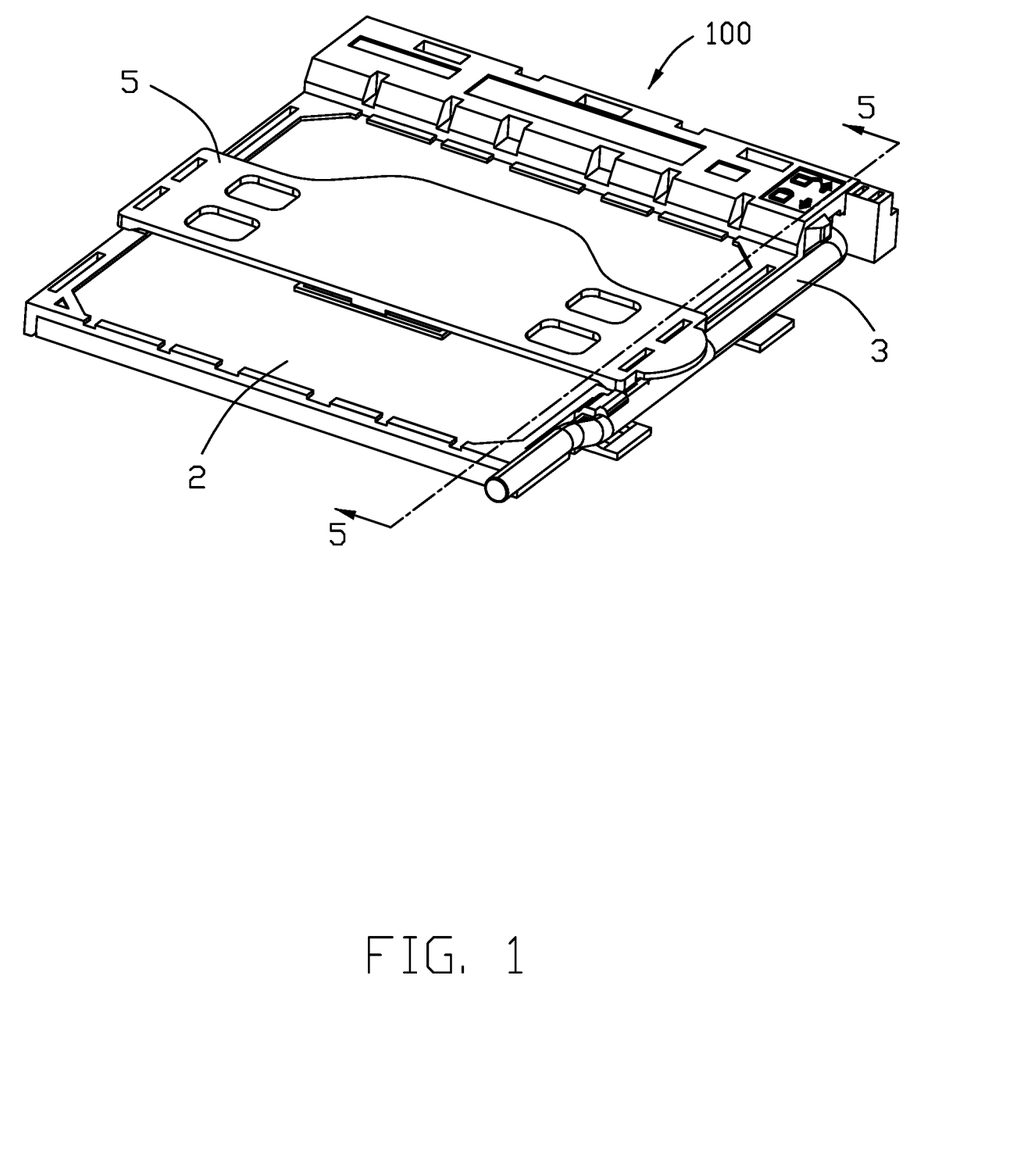
FIG. 1 is a perspective view of an electrical connector according to an embodiment of the invention.
Figure 2:
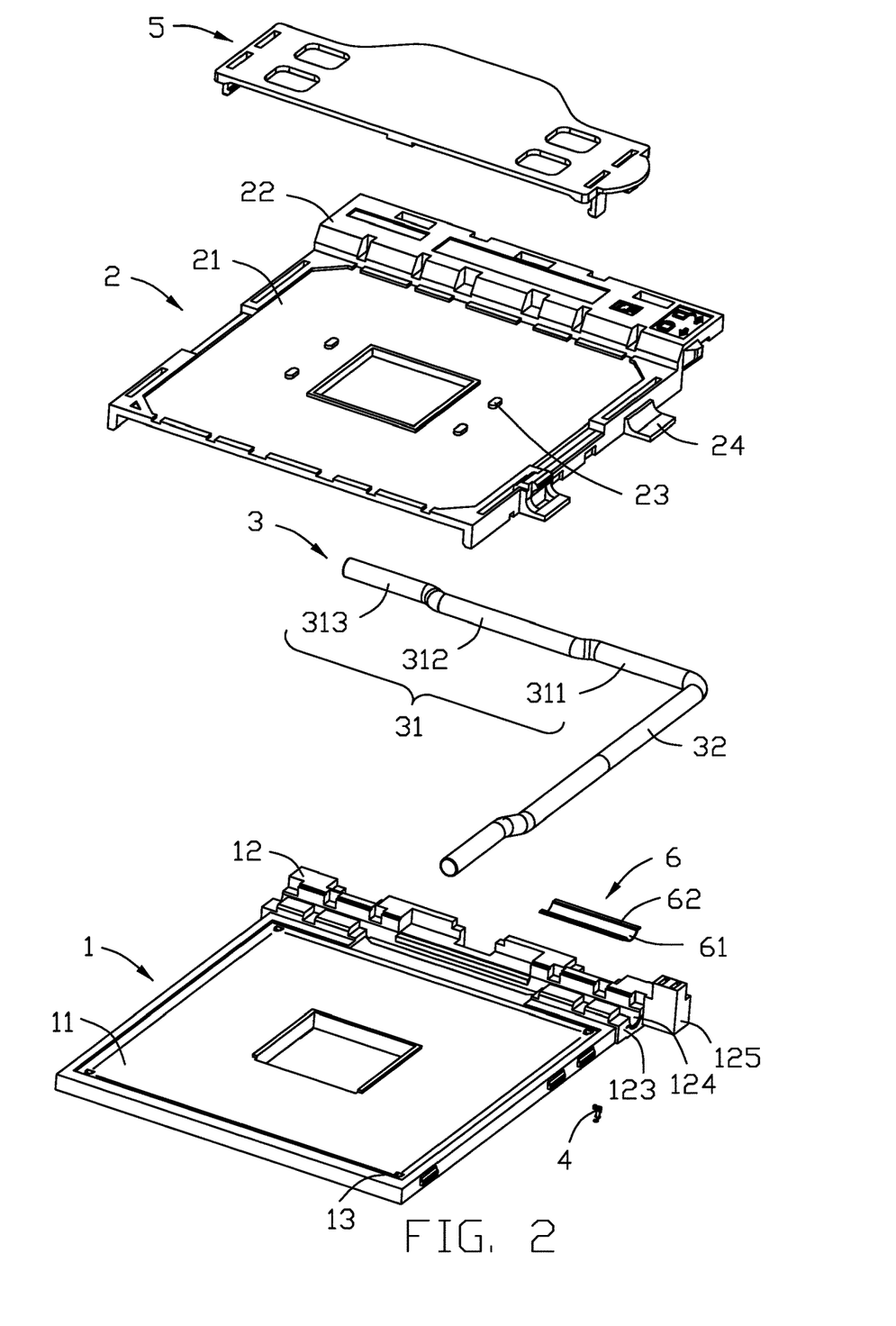
FIG. 2 is an exploded perspective view of the electrical connector of FIG. 1.
Figure 3:
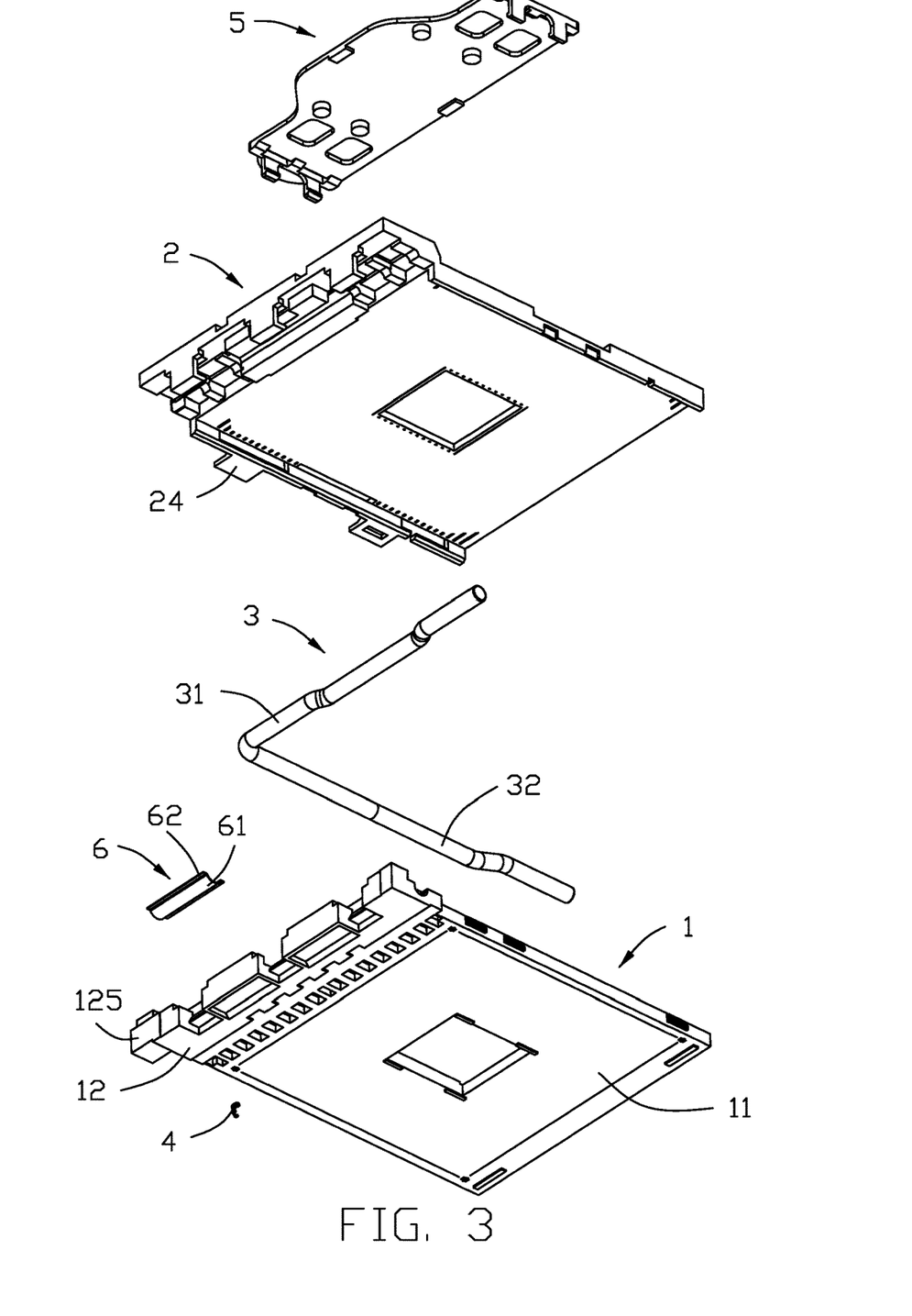
FIG. 3 is another exploded perspective view of the electrical connector of FIG. 2.
Figure 4:
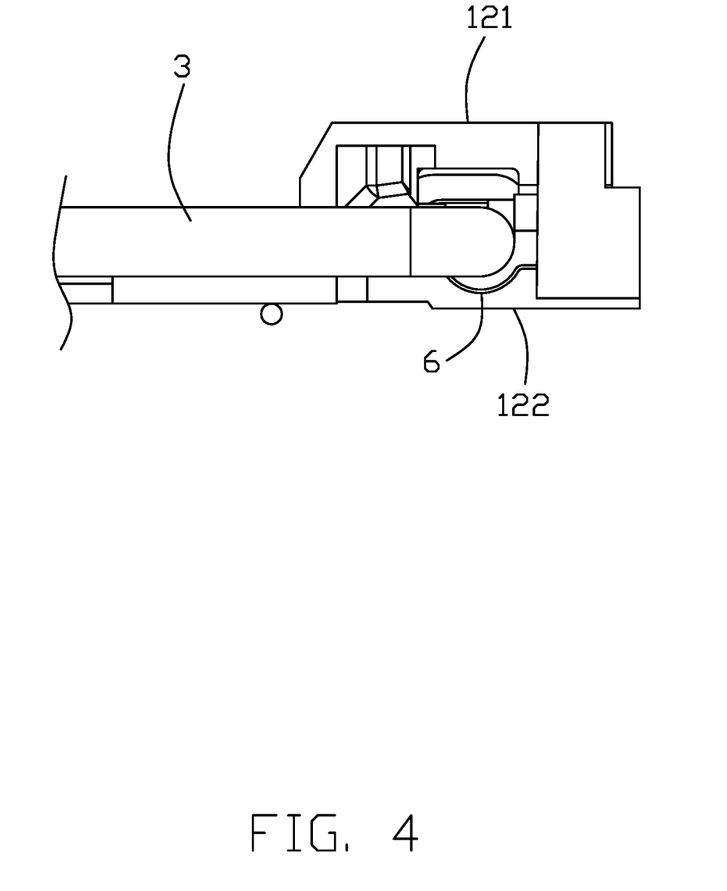
FIG. 4 is a partial side view of the electrical connector of FIG. 1.
Figure 5:
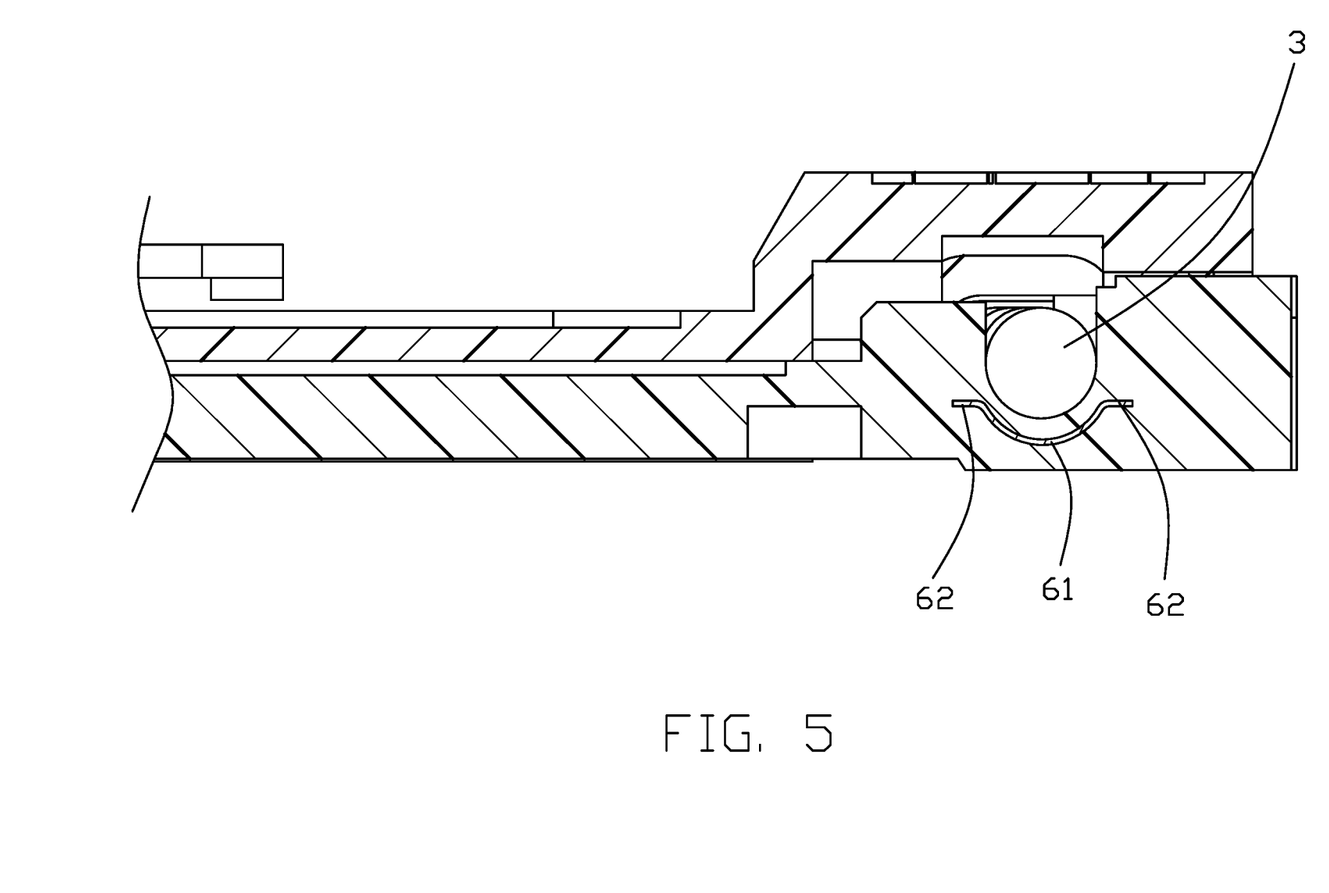
FIG. 5 is a partial cross-sectional view of the electrical connector of FIG. 1.
Figure 6:
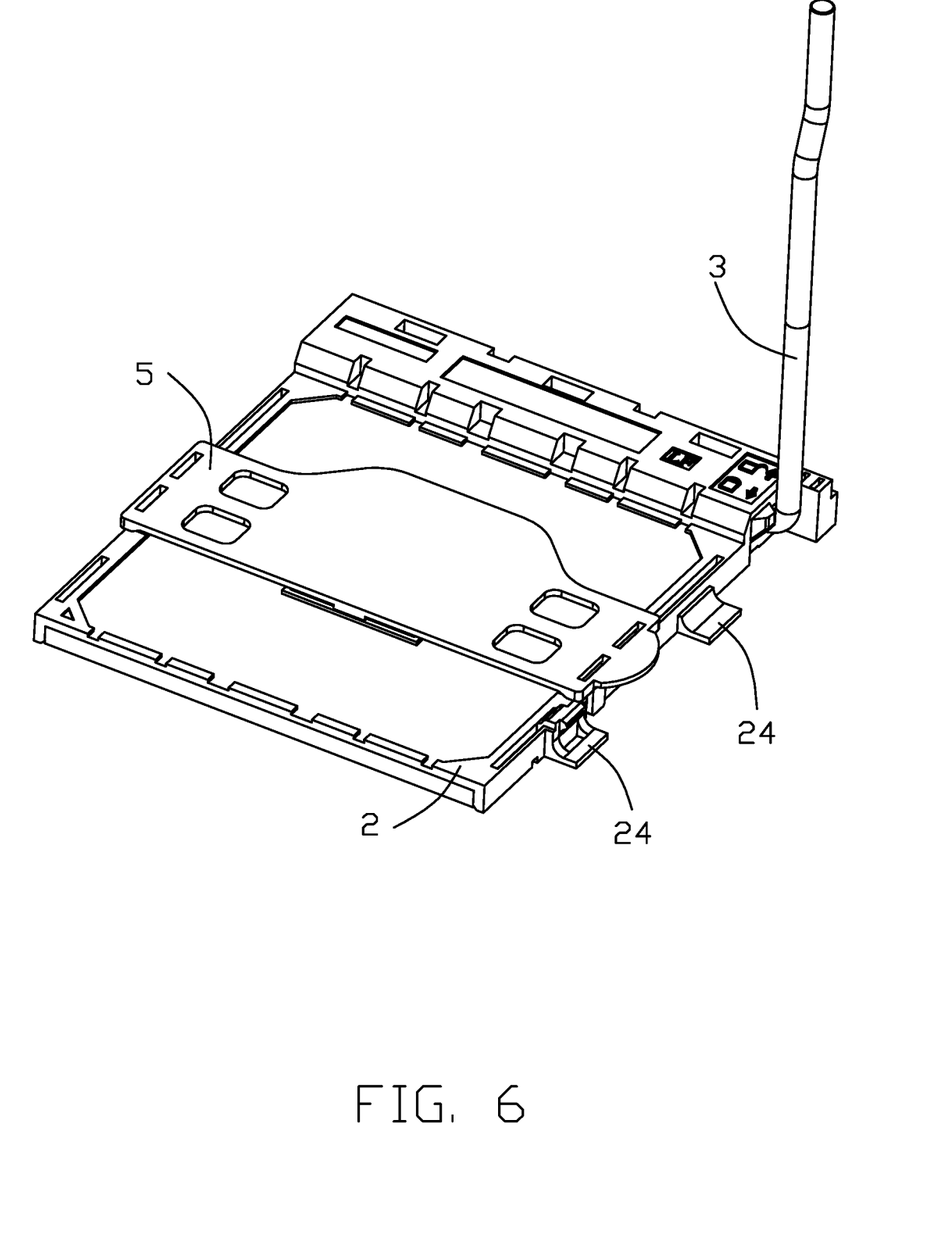
FIG. 6 is a perspective view of the electrical connector of FIG. 1 when the lever is moved to a vertical position.
Figure 7:
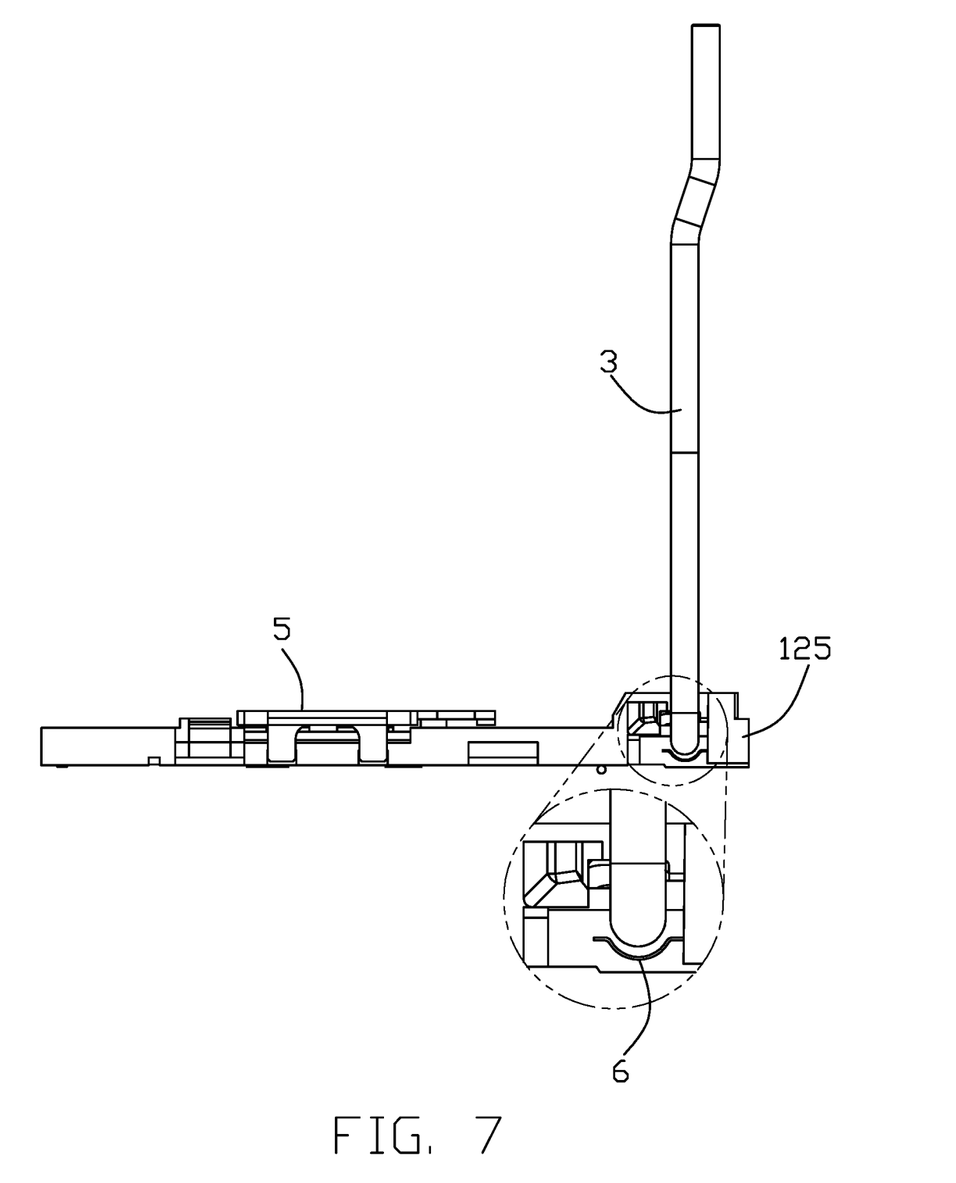
FIG. 7 is a side view of the electrical connector of FIG. 6.
Figure 8:
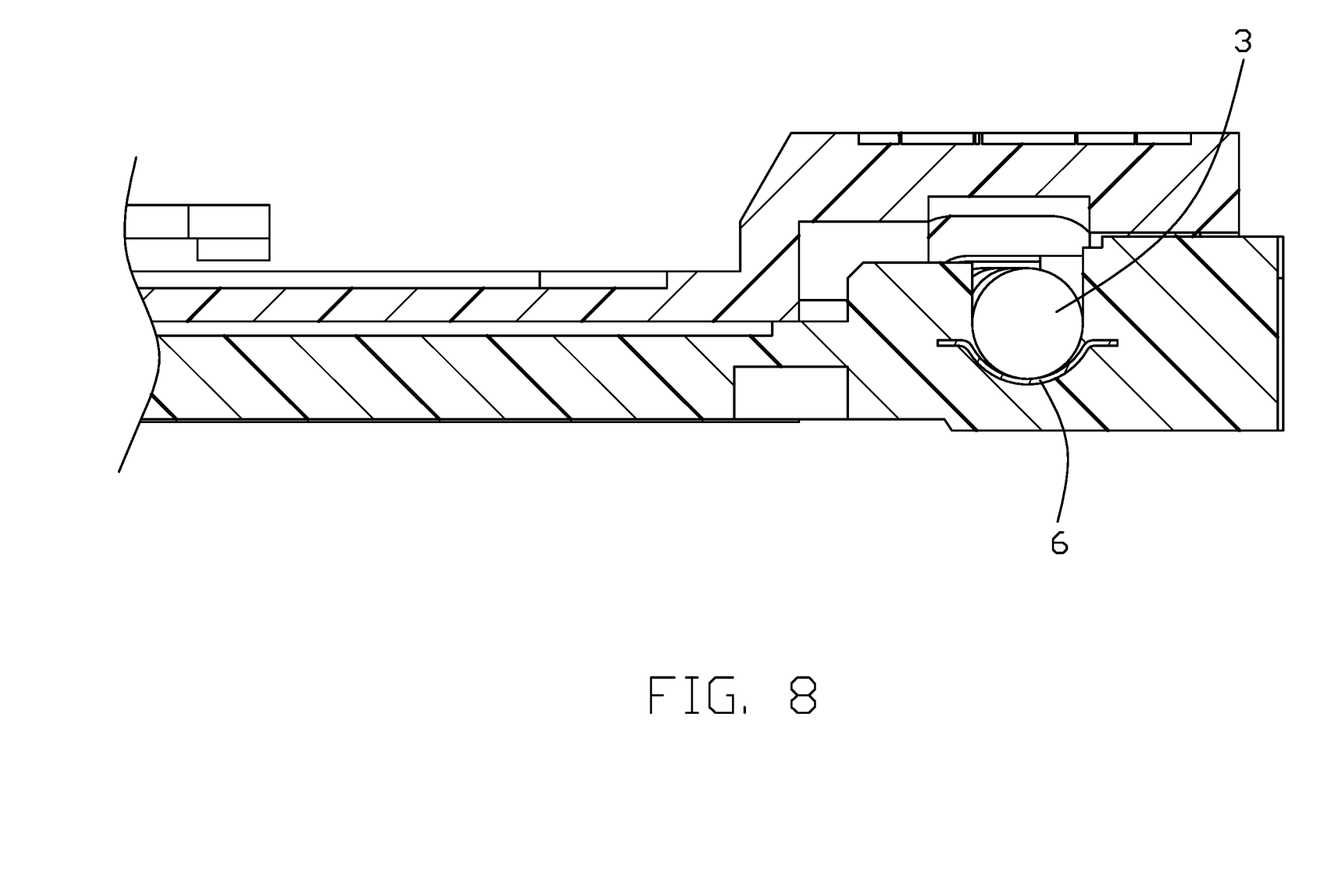
FIG. 8 is a partial cross-sectional view of the electrical connector of according to another embodiment of the invention.

The metallic reinforcement piece 6 embedded within the holding region 11 via insert-molding, is located between the actuating bar 31 and the bottom surface 122. The reinforcement piece 6 may be hidden under the receiving groove 124 (FIG. 5) or exposed on the receiving groove (FIG. 8). The reinforcement piece 6 includes a curved main part 61 optimally compliant with a configuration of the receiving groove 124, and a pair of side wings 62 extending horizontally from two opposite side edge of the receiving groove 125 and away from each other symmetrically for enlarging the occupying area of the whole reinforcement piece 6. The wings 62 may enhance retention of the reinforcement piece 6 within the holding region 12 so as to allow the reinforcement piece 6 to endure more forces applied thereon.

In the embodiments, the dimension of the reinforcement piece 6 along the axial direction of the receiving groove 124 is smaller than that of the supporting section 311, 313 for complying with the configuration/dimension of the receiving groove along the axial direction. Understandably, because the reinforcement piece 6 is integrally formed within the holding region 12 of the base 1 via an insert-molding process, the holding region 12 may forms a hole to receive the core pin and/or a side opening to allow the reinforcement piece 6 is transversely linked to a carrier during the insert-molding process Understandably, the additional reinforcement piece 6 may not only resist more force exerted by the actuating bar 31 and applied upon the receiving groove 124, but also efficiently grasp the holding region 12, thus avoiding the potential cracking of the holding region 12 during operation. Alternately, in another embodiment, an additional metallic reinforcement piece (not shown) may be optimally embedded within the abutting region 22 of the cover 2 and in alignment with the urging section 312 in the front-to-back direction for resisting the force exerted from the urging section 312 of the lever 3. It is because the cover 2 is thinner than the base 1 and tends to be broken under the relatively larger force.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical connector comprising:
an insulative base including a main body and a holding region at one end thereof in a front-to-back direction;
a cover including a supporting plate aligned with the main body in a vertical direction perpendicular to front-to-back direction, and an abutting region located at one end thereof in the front-to-back direction and aligned with the holding region in the vertical direction;
a plurality of passageways formed in the main body;
a plurality of through holes formed in the cover in alignment with the corresponding passageways in the vertical direction, respectively;
a receiving groove formed in the holding region;
a plurality of contacts received within the corresponding passageways, respectively; and
a lever including an actuating bar received within the receiving groove and sandwiched between the holding region of the base and the abutting region of the cover, and an operation bar linked to the actuating bar and rotatable between a horizontal position and an upstanding position; wherein
a metallic reinforcement piece is essentially embedded, via an insert-molding process, within the holding region under the receiving groove in the vertical direction.

2. The electrical connector as claimed in claim 1, wherein the actuating bar includes two opposite supporting sections and an urging section therebetween in a transverse direction perpendicular to both the front-to-back direction and the vertical direction, the urging section is axially offset from supporting sections, and a dimension of the reinforcement piece is not larger than that of the supporting section in the transverse direction.

3. The electrical connector as claimed in claim 2, wherein the abutting region of the cover interacts with the urging section of the actuating bar in the front-to-back direction.

4. The electrical connector as claimed in claim 2, wherein the reinforcement piece is aligned with at least one of the two supporting sections in the front-to-back direction.

5. The electrical connector as claimed in claim 1, wherein the reinforcement piece includes a main part in compliance with a configuration of the receiving groove.

6. The electrical connector as claimed in claim 5, wherein the main part defines a curved configuration.

7. The electrical connector as claimed in claim 6, wherein the curved configuration is close to an arc of a circle.

8. The electrical connector as claimed in claim 5, wherein the reinforcement piece further includes a pair of wings extending from two side edges of the main part.

9. The electrical connector as claimed in claim 8, wherein the pair of wings extend symmetrical with regard to the main part, viewed along the transverse direction.

10. The electrical connector as claimed in claim 1, wherein the reinforcement piece is hidden from an exterior in the vertical direction.

11. An electrical connector comprising:
an insulative base including a main body and a holding region at one end thereof in a front-to-back direction;
a cover including a supporting plate aligned with the main body in a vertical direction perpendicular to front-to-back direction, and an abutting region located at one end thereof in the front-to-back direction and aligned with the holding region in the vertical direction;
a plurality of passageways formed in the main body;
a plurality of through holes formed in the cover in alignment with the corresponding passageways in the vertical direction, respectively;
a receiving groove formed in the holding region;
a plurality of contacts received within the corresponding passageways, respectively; and
a lever including an actuating bar received within the receiving groove and sandwiched between the holding region of the base and the abutting region of the cover, and an operation bar linked to the actuating bar and rotatable between a horizontal position and an upstanding position; wherein
a metallic reinforcement piece is essentially embedded, via an insert-molding process, within the abutting region adjacent to the receiving groove.

12. The electrical connector as claimed in claim 11, wherein the actuating bar includes two opposite supporting sections and an urging section therebetween in a transverse direction perpendicular to both the front-to-back direction and the vertical direction, the urging section is axially offset from the supporting sections, and the reinforcement piece is located in alignment with the urging section in the front-to-back direction.

13. The electrical connector as claimed in claim 11, wherein the reinforcement piece includes a main part in compliance with a configuration of the receiving groove.

14. The electrical connector as claimed in claim 13, wherein the main part defines a curved configuration.

15. The electrical connector as claimed in claim 14, wherein the curved configuration is close to an arc of a circle.

16. The electrical connector as claimed in claim 13, wherein the reinforcement piece further includes a pair of wings extending from two side edges of the main part.

17. The electrical connector as claimed in claim 16, wherein the pair of wings extend symmetrical with regard to the main part, viewed along the transverse direction.

18. The electrical connector as claimed in claim 11, wherein the reinforcement piece is hidden from an exterior in the vertical direction.

* * * * *